US008108748B2

(12) United States Patent
Nebat

(10) Patent No.: US 8,108,748 B2
(45) Date of Patent: Jan. 31, 2012

(54) MODULATION SYMBOL TO OUTER CODEWORD MAPPING

(75) Inventor: Yoav Nebat, San Diego, CA (US)

(73) Assignee: Wi-LAN Inc., Ottawa, ON (CA)

( * ) Notice: Subject to any disclaimer, the term of this patent is extended or adjusted under 35 U.S.C. 154(b) by 811 days.

(21) Appl. No.: 12/202,174

(22) Filed: Aug. 29, 2008

(65) Prior Publication Data

US 2009/0150741 A1    Jun. 11, 2009

Related U.S. Application Data

(60) Provisional application No. 61/007,360, filed on Dec. 11, 2007, provisional application No. 61/019,572, filed on Jan. 7, 2008, provisional application No. 61/024,507, filed on Jan. 29, 2008, provisional application No. 61/060,117, filed on Jun. 9, 2008.

(51) Int. Cl.
H03M 13/00    (2006.01)
(52) U.S. Cl. ........ 714/751; 714/786; 714/755; 714/758; 714/784; 370/474
(58) Field of Classification Search ................... 714/755, 714/786, 758, 784, 751; 370/474
See application file for complete search history.

(56) References Cited

U.S. PATENT DOCUMENTS

| 5,546,409 A | 8/1996 | Karasawa | |
|---|---|---|---|
| 5,826,018 A * | 10/1998 | Vixie et al. | 709/230 |
| 5,983,383 A | 11/1999 | Wolf | |
| 7,031,249 B2 * | 4/2006 | Kowalski | 370/203 |
| 2002/0147954 A1 | 10/2002 | Shea | |
| 2003/0207696 A1 | 11/2003 | Willenegger et al. | |
| 2003/0226092 A1 | 12/2003 | Kim et al. | |
| 2004/0090932 A1 | 5/2004 | Wei et al. | |
| 2004/0100937 A1 | 5/2004 | Chen | |
| 2004/0199847 A1 | 10/2004 | Calabro et al. | |
| 2004/0199850 A1 | 10/2004 | Yi et al. | |
| 2005/0135308 A1 | 6/2005 | Vijayan et al. | |
| 2006/0013168 A1 | 1/2006 | Agrawal et al. | |
| 2006/0077890 A1 | 4/2006 | Suryavanshi et al. | |

(Continued)

FOREIGN PATENT DOCUMENTS

EP    1 718 096    11/2006

(Continued)

OTHER PUBLICATIONS

Agashe et al., "CDMA2000 High Rate Broadcast Packet Data Air Interface Design," IEEE Comm. Magazine, pp. 83-89 (Feb. 2004).

(Continued)

*Primary Examiner* — Guy Lamarre
(74) *Attorney, Agent, or Firm* — Volpe and Koenig, P.C.

(57) ABSTRACT

The subject matter disclosed herein provides an outer coding framework that, in some implementations, provides frequency diversity to outer codewords that are mapped to modulation symbols. In one aspect, there is provided a method. The method may include inserting a received packet into a frame. Moreover, an outer code may be used to encode the frame. Furthermore, the values read from a column of the frame may be inserted into a link-layer packet. In addition, the column may be shuffled by moving the values of the column based on an offset. The link-layer packet may also be provided to enable an inner code to encode the link-layer packet before transmission.
Related systems, apparatus, methods, and/or articles are also described.

15 Claims, 8 Drawing Sheets

U.S. PATENT DOCUMENTS

| | | | |
|---|---|---|---|
| 2007/0004437 | A1 | 1/2007 | Harada et al. |
| 2007/0101228 | A1 | 5/2007 | Vesma et al. |
| 2007/0165578 | A1* | 7/2007 | Yee et al. ............... 370/337 |
| 2007/0230351 | A1 | 10/2007 | Dang |
| 2007/0240027 | A1 | 10/2007 | Vesma et al. |
| 2007/0253367 | A1 | 11/2007 | Dang et al. |
| 2007/0268933 | A1 | 11/2007 | Wu et al. |
| 2008/0022345 | A1 | 1/2008 | Kim et al. |
| 2008/0098283 | A1 | 4/2008 | Vayanos et al. |
| 2008/0225819 | A1* | 9/2008 | Niu et al. ............... 370/342 |
| 2009/0259920 | A1 | 10/2009 | Guo et al. |
| 2010/0183077 | A1 | 7/2010 | Lee et al. |

FOREIGN PATENT DOCUMENTS

| | | |
|---|---|---|
| KR | 10-1995-0010768 | 9/1995 |
| KR | 10-0371157 | 3/2003 |
| KR | 10-2005-0114162 | 12/2005 |
| KR | 10-2006-011864 | 10/2006 |
| KR | 10-2006-0064677 | 6/2007 |
| KR | 10-2007-0068456 | 6/2007 |
| WO | 05/022814 | 3/2005 |
| WO | 2005/022817 | 3/2005 |

OTHER PUBLICATIONS

Form PCT/ISA/220, Notification of Transmittal of the International Search Report and the Written Opinion of the International Searching Authority, or the Declaration, mailed May 18, 2009.

Form PCT/ISA/220, Notification of Transmittal of the International Search Report and the Written Opinion of the International Searching Authority, or the Declaration, mailed Apr. 30, 2009.

Form PCT/ISA/220, Notification of Transmittal of the International Search Report and the Written Opinion of the International Searching Authority, or the Declaration, mailed Apr. 20, 2009.

Form PCT/ISA/220, Notification of Transmittal of the International Search Report and the Written Opinion of the International Searching Authority, or the Declaration, mailed May 26, 2009.

Form PCT/ISA/220, Notification of Transmittal of the International Search Report and the Written Opinion of the International Searching Authority, or the Declaration, mailed Jun. 24, 2009 for corresponding PCT Application PCT/US2008/086103.

Form PCT/ISA/220, Notification of Transmittal of the International Search Report and the Written Opinion of the International Searching Authority, or the Declaration, mailed May 26, 2009 for corresponding PCT Application PCT/US2008/086278.

IEEE 802.16 Broadband Wireless Access Working Group, IEEE 802.16 1pc-00/33, "FEC Performance of Concatenated Reed Solomon and Convolutional Coding with Interleaving," (Jun. 8, 2000).

IEEE 802.16 Broadband Wireless Access Working Group, IEEE 802.16 1maint-08/293, "Optional outer-coded data mode for MBS," (Sep. 11, 2008).

Jenkac et al., "Flexible outer Reed-Solomon coding on RLC layer for MBMS over GERAN," Vehicular Technology Conference. vol. 5, pp. 2777-2781 (May 2004).

Patent Cooperation Treaty (PCT) International Search Report, PCT/US2008/085984, Notification of Transmittal of the International Search Report and the Written Opinion of the International Searching Authority, or the Declaration, mail date Mar. 27, 2009, 11 pages.

Pursley et al., "Variable-Rate Coding for Meteor-Burst Communications," IEEE Trans. On Comm., vol. 37, No. 11 (Nov. 1989).

Qualcomm, "MBMS design consideration," 3GPP TSG WGIT, R1-02-1099 (Jan. 7-10, 2003).

Wang et al., "System Architecture and Cross-Layer Optimization of Video Broadcast over WiMAX," IEEE Journal on Selected Areas in Communications, vol. 25, No. 4 pp. 712-721 (May 2007).

Wei et al., "Application of NB/WB AMR Speech Codes in the 30-kHz TDMA System," IEEE Trans. On Comm., vol. 6, No. 6 (Nov. 2004).

Form PCT/ISA/220 Notification of Transmittal of the International Search Report and the Written Opinion of the International Searching Report, or the Declaration, mailed May 26, 2009 for corresponding PCT Application PCT/US2008/086278.

Jenkac, H. et al., "Flexible outer Reed-Solomon coding on RLC layer for MBMS over GERAN", In Vehicular Technology Conference, 2004. VTC 2004-Spring. 2004 IEEE 59th vol. 5, May 17-19, 2004, pp. 2777-2781, vol. 5.

* cited by examiner

MODULATION SYMBOL TO OUTER CODEWORD MAPPING

CROSS REFERENCE TO RELATED APPLICATION

This application claims the benefit under 35 U.S.C. §119 (e) of the following provisional applications, all of which are incorporated herein by reference in their entirety: U.S. Ser. No. 61/007,360, entitled "Multimedia Broadcast System," filed Dec. 11, 2007; U.S. Ser. No. 61/019,572, entitled "Multimedia Broadcast System," filed Jan. 7, 2008; U.S. Ser. No. 61/024,507, entitled "Multimedia Broadcast System," filed Jan. 29, 2008; and U.S. Ser. No. 61/060,117, entitled "Multimedia Broadcast System," filed Jun. 9, 2008.

FIELD

The subject matter described herein relates to wireless communications.

BACKGROUND

Channel coding, such as forward error-correction coding or error-correction coding, introduces redundancy into a signal prior to transmission or storage of the signal. The redundancy enables a receiving system to detect and, perhaps, correct errors introduced into the signal by, for example, the channel, receiver, transmitter, storage medium, and the like. For example, in a communication system that employs forward error-correction coding, a source provides data to an encoder (also referred to as a coder). The encoder inserts redundant (also sometimes referred to as parity) bytes, thereby outputting a longer sequence of code bytes, called a codeword. The codewords can then be transmitted to a receiver, which uses a suitable decoder to extract the original, unencoded data and correct errors caused by, for example, the channel and/or the receiver.

Channel coding can thus be used to detect and/or correct errors—reducing the need for the source transmitter to retransmit data received in error. By reducing the need to retransmit data that is in error, the throughput of the channel or link is improved. Moreover, the correction of errors also improves the quality of the data received at the receiver. In the case of a digital video broadcast, error-correction coding enhances not only the quality of the digital video broadcast over the wireless channel but also improves the throughput of the wireless channel.

SUMMARY

The subject matter disclosed herein provides outer coding and, in particular, a mapping of outer codewords to modulation symbols, such as orthogonal frequency division multiple access (OFDMA) symbols.

In one aspect, there is provided a method. The method may include inserting a received packet into a frame. Moreover, an outer code may be used to encode the frame. Furthermore, the values read from a column of the frame may be inserted into a link-layer packet. In addition, the column may be shuffled by moving the values of the column based on an offset. The link-layer packet may also be provided to enable an inner code to encode the link-layer packet before transmission.

In another aspect, there is provided a method. The method may include receiving a plurality of link-layer packets. One of the received link-layer packets may be inserted into one of a plurality of columns of a frame. The column may be de-shuffled by moving values of the column based on an offset. The frame may be decoded using an outer code. One or more values read from the decoded frame may be inserted into an application data packet.

In one aspect, there is provided a method. The method may include inserting a received packet into a frame. The frame may be encoded using an outer code. One or more values read from one of a plurality of columns of the frame may be inserted into a link-layer packet. The columns may be configured to be longer than a length of the link-layer packet. The link-layer packet may be provided to enable an inner code to encode the link-layer packet before transmission.

In yet another aspect, there is provided a method. The method may include decoding, using an inner code, one or more link-layer packets. One of the decoded link-layer packets may be inserted into one of a plurality of columns of a frame. The columns may be configured to be longer than a length of the link-layer packet. The frame may be decoded using an outer code. One or more values read from the decoded frame may be inserted into an application data packet.

Variations to the above aspects may include one or more of the following features. The outer code may be implemented as a Reed-Solomon forward error-correction code, and the frame may be implemented as a Reed-Solomon table comprising a plurality of rows and a plurality of columns. An inner code may be used to encode the link-layer packet. The inner code may be implemented as a forward-error correction code. The link-layer packets may be sent as a hybrid automatic retransmission request (HARQ) protocol data unit (PDU) including at least one of a cyclic redundancy check (CRC) and a header. The received packet may be inserted an application data packet. An offset may be determined as a value representing a column number minus one. Shuffling of the column may be performed based on the offset.

Moreover, the methods described herein, including the above noted aspects and variations, may be embodied as a computer-readable medium containing instructions to configure at least one processor to perform those methods, and may be embodied as a system.

The details of one or more variations of the subject matter described herein are set forth in the accompanying drawings and the description below. Features and advantages of the subject matter described herein will be apparent from the description and drawings, and from the claims.

Figure 1:
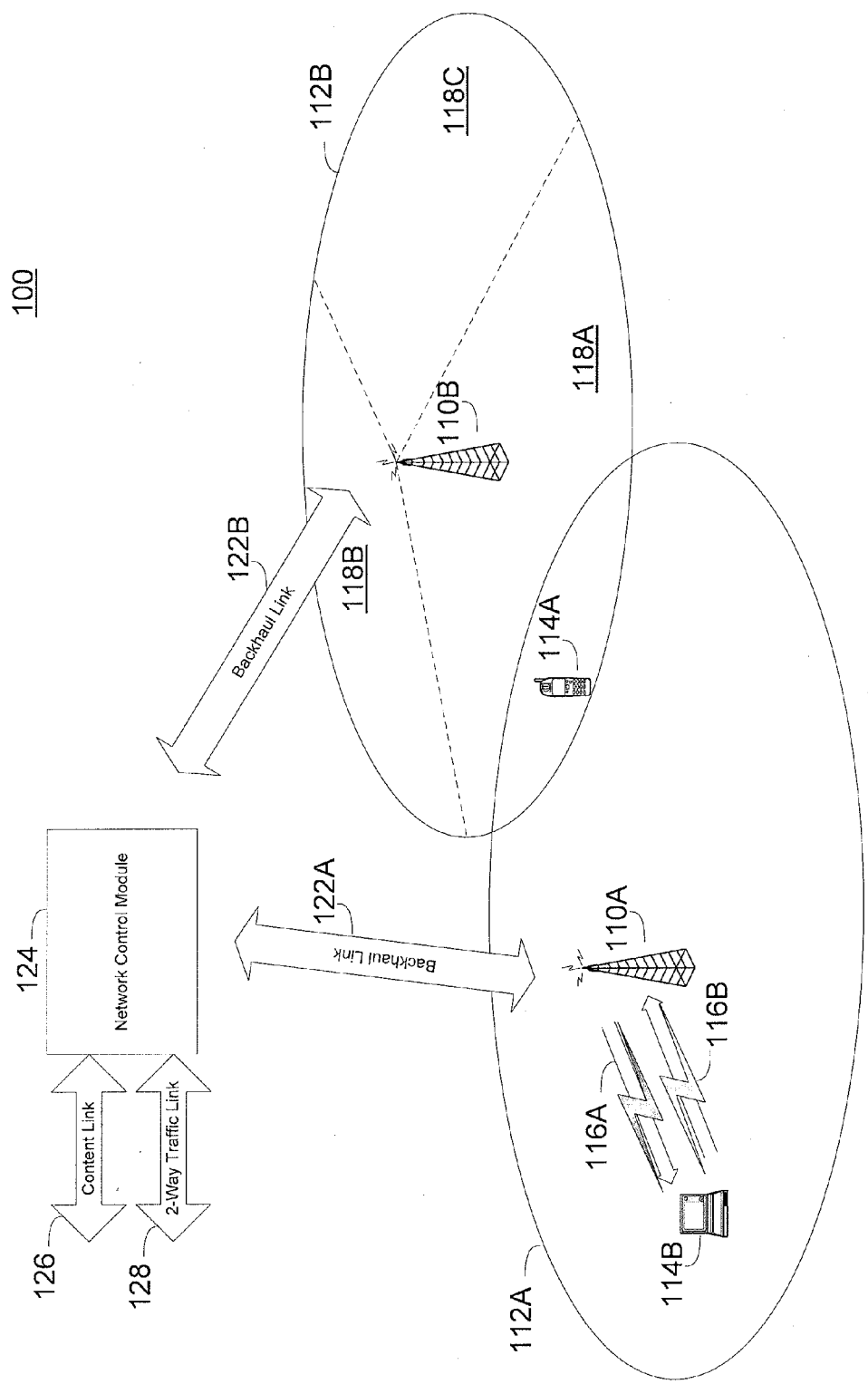
FIG. 1 depicts a block diagram of a network including client stations and base stations.

Like labels are used to refer to same or similar items in the drawings.

DETAILED DESCRIPTION

FIG. 1 is a simplified functional block diagram of an embodiment of a wireless communication system 100. The wireless communication system 100 includes a plurality of base stations 110A and 110B, each supporting a corresponding service or coverage area 112A and 112B. The base stations are capable of communicating with wireless devices within their coverage areas. For example, the first base station 110A is capable of wirelessly communicating with a first client station 114A and a second client station 114B within the coverage area 112A. The first client station 114A is also within the coverage area 112B and is capable of communicating with the second base station 110B. In this description, the communication path from the base station to the client station is referred to as a downlink 116A and the communication path from the client station to the base station is referred to as an uplink 116B.

Although for simplicity only two base stations are shown in FIG. 1, a typical wireless communication system 100 includes a much larger number of base stations. The base stations 110A and 110B can be configured as cellular base station transceiver subsystems, gateways, access points, radio frequency (RF) repeaters, frame repeaters, nodes, or any wireless network entry point.

The base stations 110A and 110B can be configured to support an omni-directional coverage area or a sectored coverage area. For example, the second base station 110B is depicted as supporting the sectored coverage area 112B. The coverage area 112B is depicted as having three sectors, 118A, 118B, and 118C. In typical embodiments, the second base station 110B treats each sector 118 as effectively a distinct coverage area.

Although only two client stations 114A and 114B are shown in the wireless communication system 100, typical systems are configured to support a large number of client stations. The client stations 114A and 114B can be mobile, nomadic, or stationary units. The client stations 114A and 114B are often referred to as, for example, mobile stations, mobile units, subscriber stations, wireless terminals, or the like. A client station can be, for example, a wireless handheld device, a vehicle mounted device, a portable device, client premise equipment, a fixed location device, a wireless plug-in accessory or the like. In some cases, a client station can take the form of a handheld computer, notebook computer, wireless telephone, personal digital assistant, wireless email device, personal media player, meter reading equipment, or the like and may include a display mechanism, microphone, speaker and memory.

In a typical system, the base stations 110A and 110B also communicate With each other and a network control module 124 over backhaul links 122A and 122B. The backhaul links 122A and 122B may include wired and wireless communication links. The network control module 124 provides network administration and coordination as well as other overhead, coupling, and supervisory functions for the wireless communication system 100.

In some embodiments, the wireless communication system 100 can be configured to support both bidirectional communication and unidirectional communication. In a bidirectional network, the client station is capable of both receiving information from and providing information to the wireless communications network. Applications operating over the bidirectional communications channel include traditional voice and data applications. In a unidirectional network, the client station is capable of receiving information from the wireless communications network but may have limited or no ability to provide information to the network. Applications operating over the unidirectional communications channel include broadcast and multicast applications. In one embodiment, the wireless system 100 supports both bidirectional and unidirectional communications. In such an embodiment, the network control module 124 is also coupled to external entities via, for example, content link 126 (e.g., a source of digital video and/or multimedia) and two-way traffic link 128.

The wireless communication system 100 can be configured to use Orthogonal Frequency Division Multiple Access (OFDMA) communication techniques. For example, the wireless communication system 100 can be configured to substantially comply with a standard system specification, such as IEEE 802.16 and its progeny or some other wireless standard such as, for example, WiBro, WiFi, Long Term Evolution (LTE), or it may be a proprietary system. The subject matter described herein is not limited to application to OFDMA systems or to the noted standards and specifications. The description in the context of an OFDMA system is offered for the purposes of providing a particular example only.

As used herein, IEEE 802.16 refers to one or more Institute of Electrical and Electronic Engineers (IEEE) Standard for Local and metropolitan area networks, Part 16: Air Interface for Fixed Broadband Wireless Access Systems, 1 Oct. 2004, IEEE Standard for Local and metropolitan area networks, Part 16: Air Interface for Fixed and Mobile Broadband Wireless Access Systems, 26 Feb. 2006, and any subsequent additions or revisions to the IEEE 802.16 series of standards.

In some embodiments, downlink 116A and uplink 116B each represent a radio frequency (RF) signal. The RF signal may include data, such as voice, video, images, Internet Protocol (IP) packets, control information, and any other type of information. When IEEE-802.16 is used, the RF signal may use OFDMA. OFDMA is a multi-user version of orthogonal frequency division multiplexing (OFDM). In OFDMA, multiple access is achieved by assigning to individual users groups of subcarriers (also referred to as subchannels or tones). The subcarriers are modulated using BPSK (binary phase shift keying), QPSK (quadrature phase shift keying), QAM (quadrature amplitude modulation), and carry symbols including data coded using a forward error-correction code.

Figure 2:
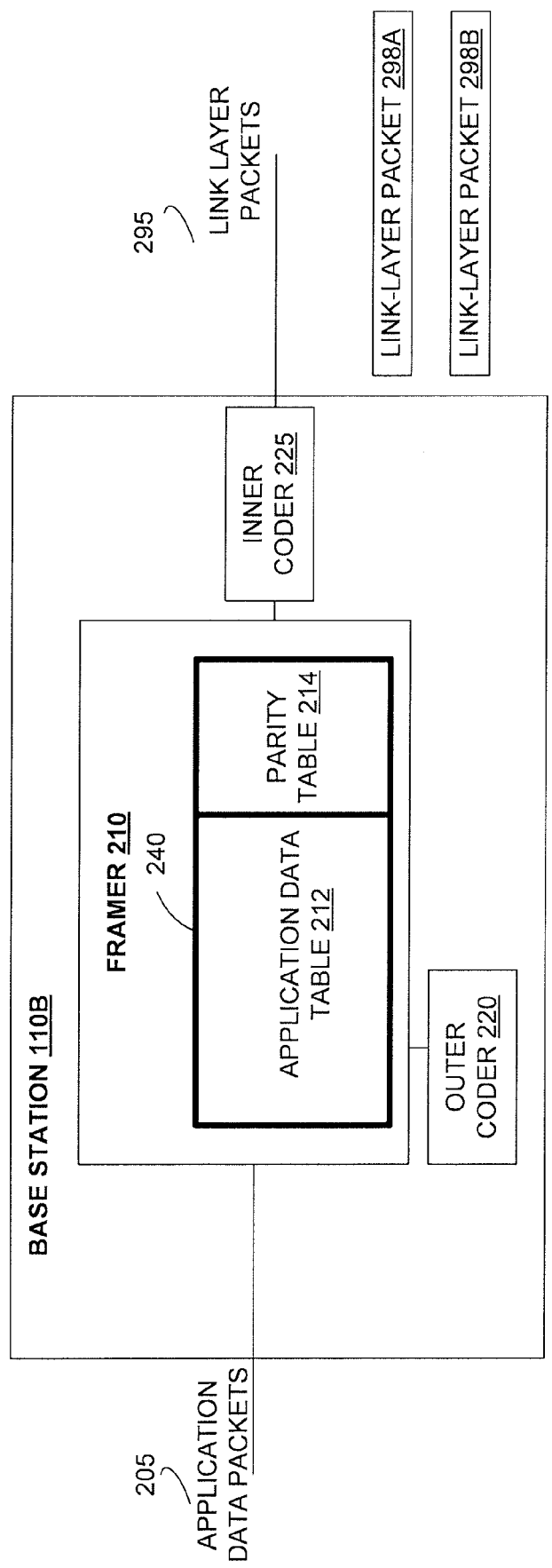
FIG. 2 depicts a block diagram of a base station using outer coding on application data packets.

FIG. 2 depicts an implementation of base station 110B. Base station 110B includes a framer 210 for arranging data into a frame 240, an outer coder 220 for providing an outer coding on the data in the frame 240, and an inner coder 225 for further encoding data that has been encoded by the outer coder 220.

The frame 240 further includes an application data table 212 and a parity table 214. The "data" values in frame 240 may be data, such as application data packets 205, or may be references to memory locations where the data can be accessed in memory. Moreover, frame 240 including application data packets may be stored in a storage medium such as, for example volatile or non-volatile storage mediums. Exemplary volatile storage mediums include random access memory (RAM), such as dynamic RAM (DRAM), static RAM (RAM), and the like. Exemplary non-volatile storage mediums may include magnetic RAM (MRAM), battery backed RAM, and the like. Moreover, the memory provided by the storage medium is typically addressed by rows and columns, such that a memory location can be identified by its row and column. For example, framer 210 may write to and read from frame 240 using the row and column addresses of frame 240 and those read-write operations may result in an access to a corresponding location in memory (e.g., the location in memory being addressed as a row and column in memory using a virtual address or a physical address in memory).

In some embodiments, the components of base station 110B may be distributed in one or more locations. For example, the framer 210 and outer coder 220 are implemented at a control module, such as network control module 124, a base station controller, or the like, while inner coder 225 is implemented at each of base stations 110A and 110B. In this example, frame 240 may be sent to each of base stations 110A and 110B, and each of the base stations may encode blocks (e.g., link-layer packets as described below) read from the columns of frame 240 before those encoded blocks are sent to a client station or other device, such as a storage device. Moreover, in some implementations, inner coder 225 is disabled or not included, such that the outer coder 220 is the primary or sole forward error-correction mechanism.

Moreover, in some implementations, a Reed-Solomon forward error-correction coder is the outer coder 220. When that is the case, the frame 240 is referred to as an RS table and each row of frame 240 is an RS codeword. For example, the outer coder 220 may use an RS (255,243) code as the outer code. The RS (255,243) code corresponds to a code that takes as an input 243 bytes and outputs a resulting codeword of 255 bytes. Because a Reed-Solomon code is a systematic code, the first 243 positions of the row (which fall in the application data table 212) will be left unchanged and the next 12 columns of the row (which fall in parity table 214) will include the computed parity bytes. Encoding with the RS (255,243) code would thus result in application data table 212 having 243 bytes per-row and parity table 214 having 12 parity bytes per-row. For example, when outer coder 220 uses an RS (255,243) code, the outer coder 220 would encode 243 bytes in the first row of application data table 212 and generate the 12 bytes of parity, such that the RS codeword for the first row is 255 bytes, i.e., 243+12. In this example, outer coder 220 would continue to use the RS (255,243) code to encode any remaining rows in frame 240. Although Reed-Solomon is described herein as the outer code, other codes (as well as codes of other sizes) may be used as well including codes that are not systematic, i.e., resulting in a codeword that does not necessarily include a portion that is identical to the original input. Moreover, in some implementations, the Reed-Solomon code may be an RS (255, Y) code, where Y is an odd number between 191 and 253. Although the above example relates to a specific number of rows and columns, frame 240 may be implemented to have any number of rows and columns.

Furthermore, in some implementations, inner coder 225 provides error-correction coding and/or forward-error correction coding, such as a Convolution Code (CC), a Convolutional Turbo Code (CTC), and the like.

Figure 3:
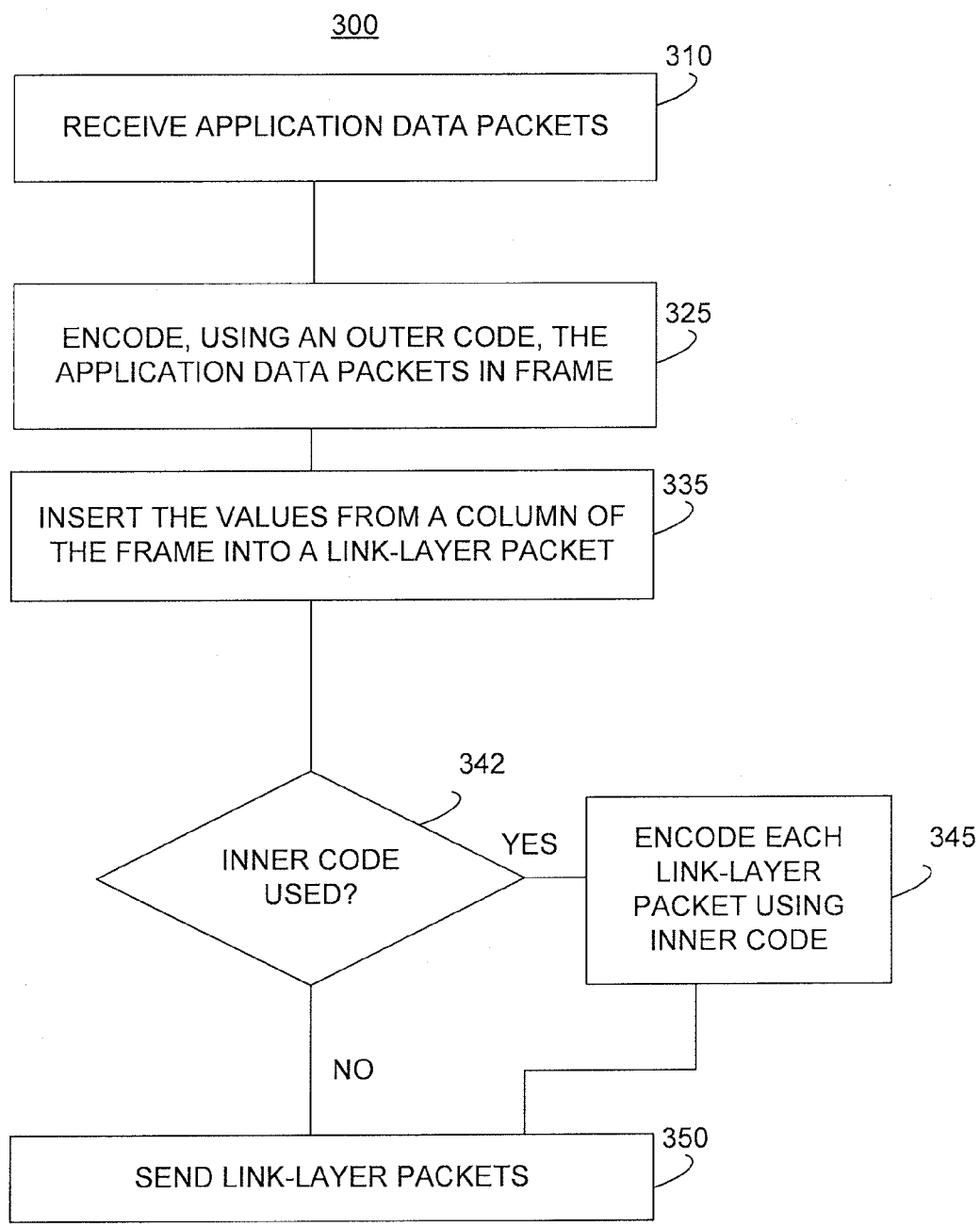
FIG. 3 depicts a process for using outer coding on application data packets received at a base station.

FIG. 3 depicts a process 300 for using an outer code on packets. The description of process 300 refers to FIGS. 2 and 4A-B as well.

At 310, one or more application data packets are received. In some implementations, base station 110B receives one or more packets, such as application data packets 205, which are inserted into frame 240 and, in particular, application data table 212. The application data packets 205 may be received from content link 126, two-way traffic link 128, a base station, or any other component of network 100. The application data packets 205 may include broadcast data, such as a digital video broadcast, although any other data may be included in application data packets. The received packet 205 may be inserted into application data table 212 in any manner including, for example, a column-by-column basis. When a column-by-column approach is used, each of the application data packets is inserted in a given column of the application data table 212. Moreover, in some implementations, the columns of application data table 240 are sized to have a sufficient number of rows to accommodate a packet. For example, the columns of frame 240 may all be configured to have a length of 181 rows to accommodate 181 bytes, which in this example is the maximum expected length of a packet. In this example, a packet having 181 bytes would be inserted into column 1, rows 1-181 of application data table 212, and another packet having 181 bytes would be inserted into column 2, rows 1-181 of application data table 212, and so forth.

Figure 4A:
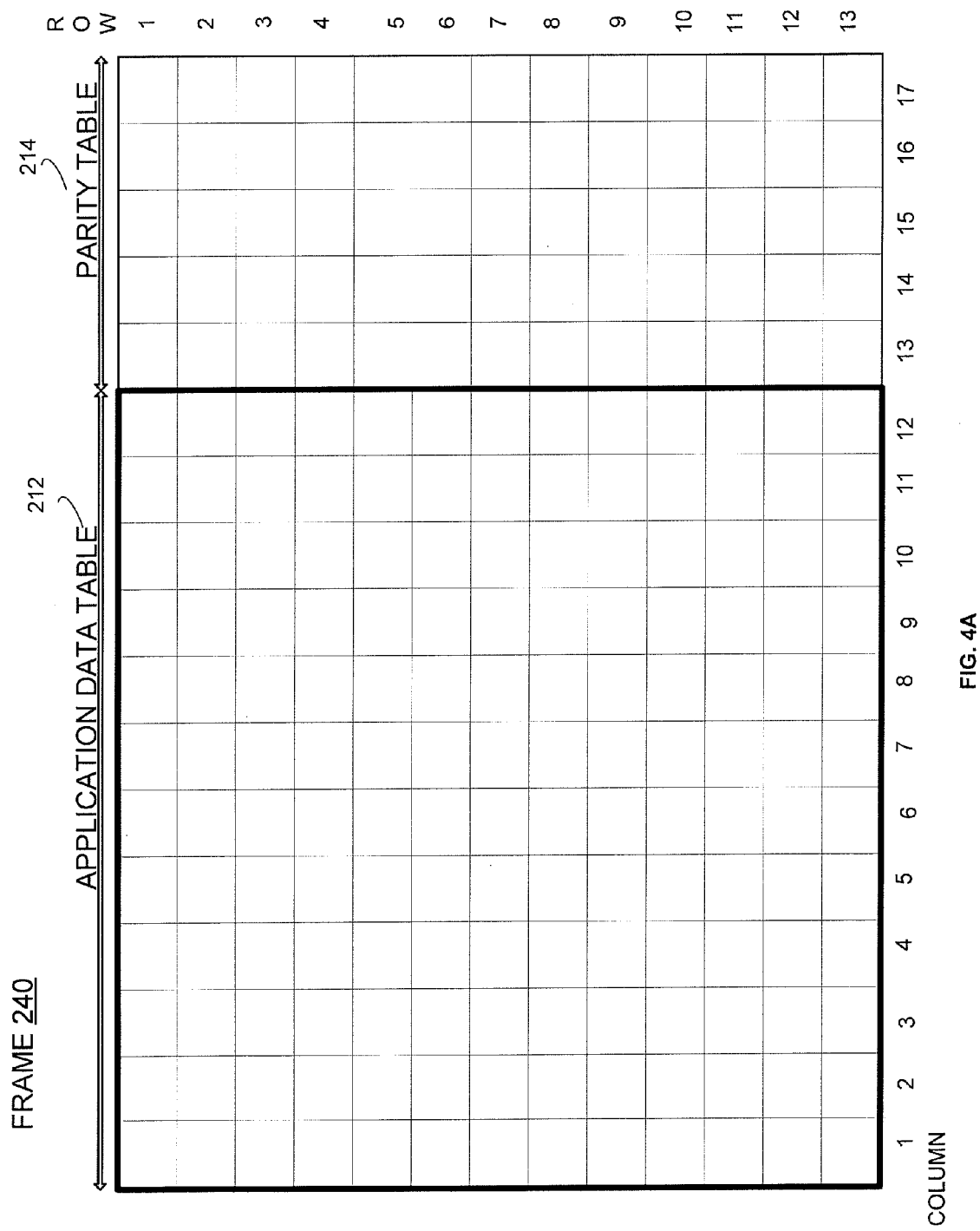
FIGS. 4A and 4B depict examples of frames during the process of outer coding at the base station.

At 325, outer coder 220 may encode, using an outer code, the application data packets 205 of frame 240. For example, the outer coder 220 may encode each row of the application data table 212 using, for example, a Reed-Solomon forward-error correction coder. FIG. 4A depicts the frame 240, such as a Reed-Solomon table including an application data table 212 and a parity table 214. A Reed-Solomon coder may encode the values of, for example, row 1 of the application data table 212 (e.g., the 12 bytes of columns 1-12), and provide a Reed-Solomon codeword having, in this example, a length of 17 bytes, 5 of which are parity symbols. In other implementations, a Reed-Solomon (RS) (255, 243) coder is used as outer coder 220, and frame 240 is sized to have 255 columns (e.g., 243 columns in the application data table 212 and 12 columns in the parity table 214 ). When an RS (255,243) coder is used as the outer coder 220, 243 bytes are input into the outer coder 220, which results in an output of 255 bytes, 12 of which represent parity symbols. Although the examples described above refer to specific sizes of RS coders, these are only examples as other size coders may be used as well.

At 335, the values from a column of frame 240 are read and inserted into a link-layer packet. For example, the framer 210 reads the values (e.g., bytes) from column 1 of frame 240, and inserts the read values (which were encoded at 325) into a link-layer packet 298A. Framer 210 also reads the values from column 2 and inserts the values of column 2 into a link-layer packet 298B, and so forth across the columns of frame 240. In the implementation of FIG. 4A, for each column of the frame 240, the framer 210 reads all of the values from the column, and inserts all of the read values into a link-layer packet. The phrase "link-layer packets" refers to a type of packet that may be exchanged between a base station and a client station. For example, in some embodiments, the link-layer packet may be a protocol data unit (PDU) that includes a header in the front and a cyclic redundancy check (CRC) appended to the end of the data, such as a hybrid automatic retransmission request (HARQ) PDU in conformance with the IEEE 802.16 standard, or the link-layer packet may be a PDU that does not include a header and an appended CRC, but is instead simply the read data block, which may subsequently be coded using an inner code.

In some embodiments, framer 210 may perform "column shuffling" to the values of the columns of frame 240 (e.g., after the encoding of 325). For example, framer 210 shuffles the values read from a column by a predetermined offset (e.g., the given column number minus 1). Referring to the example in FIG. 4A, column 1 is not shuffled (e.g., 1−1=0 offset). Column 2 is shuffled by an offset of 1 (e.g., 2−1=1 offset). Given an offset of 1, the value in the last row of column 2 is moved to the first row of column 2, and all the other values in column 2 are pushed down by the offset of 1. Table 1 depicts example values in column 2 before shuffling and after shuffling. Column 3 is shuffled by an offset of 2 (e.g., 3−1=2 offset). Given an offset of 2, the values of the last two rows of column 3 (e.g., the values at rows 12 and 13) are moved to the first two rows of column 3, and the other values of column 3 are pushed down by 2. The shuffling continues throughout the columns of frame 240. The shuffled packets are then inserted (e.g., packed) into link-layer packets and sent to a client station, such as client station 114A (e.g., as described with respect to 335-350). At the client station 114A, the shuffling would be de-shuffled (e.g., in the inverse of the process described above) to undo the shuffling performed by framer 210. Although the above implementation describes an offset of 1, any other offset value may be used as well.

TABLE 1

| COLUMN 2 ORIGINAL VALUES (I.E., BEFORE SHUFFLING) | COLUMN 2 SHUFFLED VALUES (I.E., AFTER SHUFFLING WITH AN OFFSET OF 1) |
|---|---|
| 10 | 5 |
| 2 | 10 |
| 3 | 2 |
| 6 | 3 |
| 5 | 6 |
| 6 | 5 |
| 7 | 6 |
| 12 | 7 |
| 15 | 12 |
| 15 | 15 |
| 14 | 15 |
| 12 | 14 |
| 5 | 12 |

In some embodiments, rather than use the above-described column shuffling technique, the column length of the frame 240 is configured to be slightly longer than the size of the link-layer packets. For example, each column of frame 240 may be sized to have 188 rows, and the link-layer packet sized to accommodate only 180 bytes. When embodiments implement this "column sizing" technique (i.e., using a column length that is slightly longer than the size of the link-layer packet or a link-layer packet that is slight smaller than the column length), process 300 may be used as well.

Figure 4B:
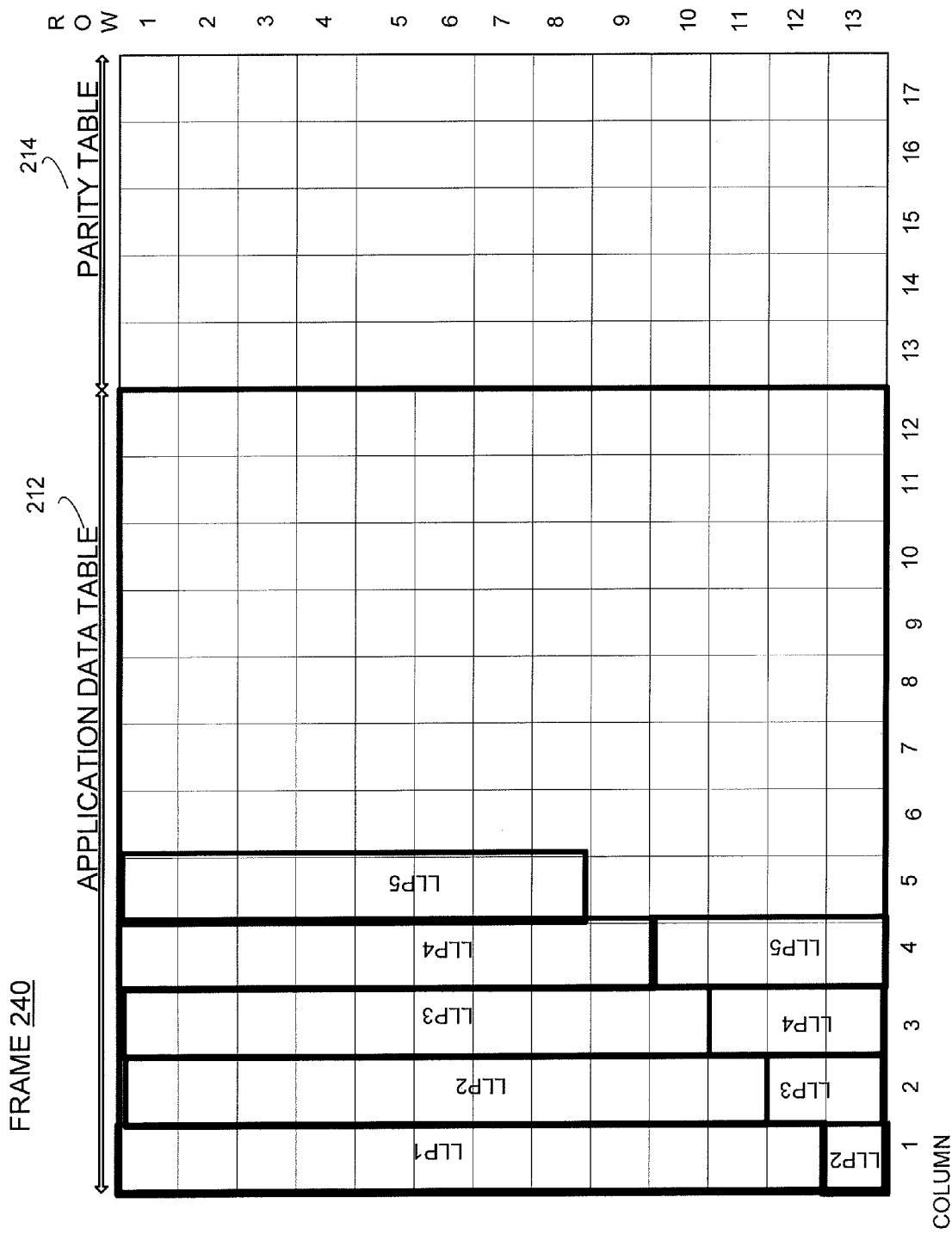

FIG. 4B depicts an example implementation of the column sizing technique. In particular, FIG. 4B depicts link-layer packets 1-5 (labeled LLP1-LLP5) in frame 240. Moreover, column 1 of frame 240 is slightly longer than the length of the first link-layer packet (LLP1) by, for example, 1 row (e.g., one byte). At 335, when framer 210 reads 12-bytes from column 1, rows 1-12, the framer 210 inserts the 12-bytes into a link-layer packet sized to accommodate 12 bytes. As such, framer 210 must ensure that the link-layer packet is configured (e.g., generated), so that it is smaller than the column length (or ensure that the frame 240 has columns that are slightly longer given the link-layer packet). Framer 240 may continue to read each of the columns of frame 210 (e.g., columns 2-5 and the like across the frame) to form link-layer packets (e.g., LLP 2-5, and the like), which can be sent as described with respect to 335-350. Moreover, the column lengths given above are only exemplary as other sized columns may be used.

In some implementations, the column shuffling technique and the column sizing technique improve frequency diversity. For example, if shuffling were not implemented, the first byte in columns 1-12 of row 1 may be carried by the same set of subcarriers. When the bits associated with these subcarriers experience a higher error rate than those associated with other sub-carriers, the first byte would have a higher likelihood of being in error for the duration of a given frame. In contrast, the column shuffling technique and the column sizing technique make sure that bits that correspond to bytes in a given row (e.g., the values in the first row of columns 1-12) are associated with a large number of different sub-carriers, which may thus improve frequency diversity. As such, the symbol columns in frame 240 (e.g., the values of the column) are shuffled before being mapped to a set of sub-carriers, such as in an OFDMA symbol.

In some implementations, an inner code is also used to further encode each of the link-layer packets (yes at 342), while in other cases the inner code is not used (no at 342). When the inner code is used at 345, inner coder 225 uses an inner code to encode each of the link-layer packets. The inner coder 225 may encode the link-layer packets using one or more error-correction or forward error-correction coding schemes, such as a Convolution Code (CC), a Convolutional Turbo Code (CTC), and the like.

At 350, the base station 110B sends the link-layer packets to a client station, such as client station 114A. When the inner code is not applied to the link-layer packets, base station 110B sends those packets through the wireless network to client station 114A, relying on the outer code to provide forward error-correction. When the inner code is applied, base station 110B sends through the wireless network to client station 114A the link-layer packets encoded with an outer code concatenated with an inner code. Moreover, the link-layer packet may be implemented as a protocol data unit (PDU) that includes a header in the front and a cyclic redundancy check (CRC) appended to the end of the data, such as a hybrid automatic retransmission request (HARQ) PDU in conformance with the IEEE 802.16 standard.

Furthermore, base station 110B may include other components to facilitate transmission, such as a radio frequency (RF) front-end comprising an antenna to transmit an RF signal, such as a downlink to client station 114A. The RF front-end may also include other components, such as filters, converters (e.g., digital-to-analog converters and the like), an Inverse Fast Fourier Transform (IFFT) module, and symbol mappers. These and other components may be used to modulate data, such as the link-layer packets, onto the RF signal transmitted by base station 110B. In some implementations, the base station 110B is compatible with IEEE 802.16 and transmits an RF signal configured as an OFDMA signal, including subcarriers carrying the link-layer packets.

Figure 5:
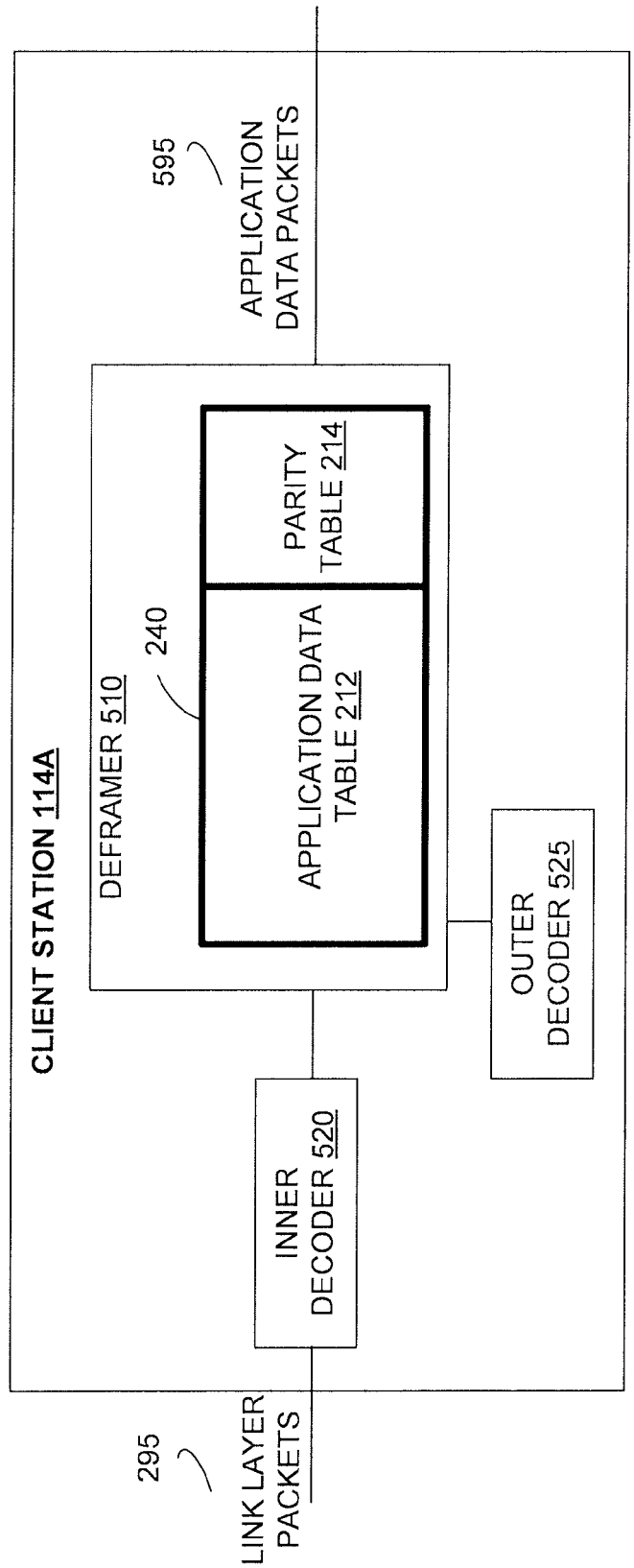
FIG. 5 depicts a block diagram of a client station using outer coding on application data packets.

FIG. 5 depicts a client station 114A. Client station 114A includes an inner decoder 520 for decoding received packets using an inner code, a deframer 510 for arranging packets (e.g., link-layer packets being decoded), and an outer decoder 525 for decoding using an outer code.

Figure 6:
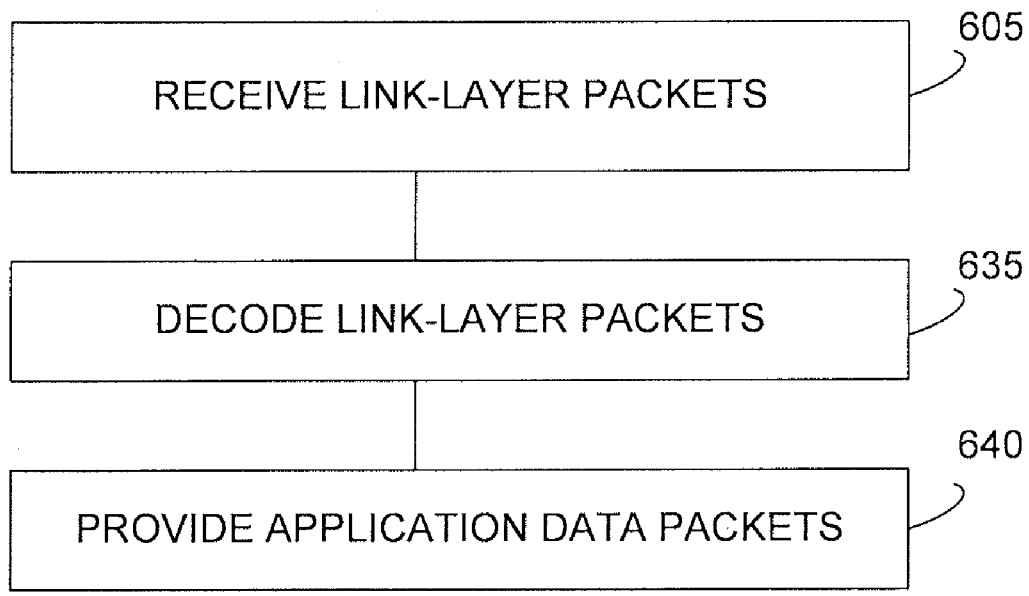
FIG. 6 depicts a process for using outer coding on application data packets received at a client station.

FIG. 6 depicts a process 600 for decoding packets, such as link-layer packets 295 received from a wireless network and base station 110B. The description of process 600 will make reference to FIGS. 4A-B, and 5.

At 605, client station 114A receives one or more link-layer packets 295 from a wireless network and base station 110B. Client station 114A may include a radio frequency (RF) front-end comprising an antenna to receive an RF signal, such as a downlink from base station 110B. The RF front-end may also include other components, such as filters, analog-to-digital converters, a Fast Fourier Transform (FFT) module, and a symbol demapper. These and other components may be used to demodulate the RF signal into data and, in particular, the link-layer packets transmitted by base station 110B and carried by the RF signal. In some implementations, the client station 114A is compatible with IEEE 802.16 and receives an RF signal configured as an OFDMA signal, including subcarriers carrying the link-layer packets.

At 635, the received link-layer packets are decoded. The link-layer packets are decode in a manner dictated by the coding process (e.g., outer and/or inner coding) used at the base station 110B and dictated by whether the framer 210 performed any column shuffling or column sizing, as described above. In other words, the link-layer packets should be processed to enable recovery of the application data packets 205, which were coded, column shuffled, column sized, and/or transmitted by the base station.

In embodiments implementing the above-described column shuffling technique on the columns of frame 240, when a link-layer packet is received, the inner decoder 520 removes (e.g., decodes) the inner code from the link-layer packet, and deframer 510 then performs a de-shuffling after the packet is inserted into the column. Moreover, if the received link-layer packet includes a header and a cyclic redundancy check (CRC) (e.g., which is the case with a HARQ PDU), framer 510 removes the header and CRC before insertion into the frame 240.

As used herein, the term de-shuffling refers to undoing any shuffling performed, for example, by the framer. For example, if the link-layer packet is from a first column (which in the above example is not shuffled), deframer 510 writes the link-layer packet into column 1 of frame 240 and does not de-shuffle. However, if the link-layer packet is from column 2 (which in the example above was shuffled with an offset of 1), deframer 510 inserts the link-layer packet into column 2 and de-shuffles the shuffling performed by the base station. Referring to Table 1 again, deframer 510 may receive a link-layer packet with shuffled values (e.g., the values at the right side of Table 1), and the deframer 510 inserts those shuffled values into column 2 of frame 240 and then de-shuffles the values of column 2 (e.g., yielding the original, left side of Table 1). Deframer 510 processes each received link-layer packet and the corresponding columns of frame 240 to remove the shuffling performed by the base station. Although the above described that shuffling and de-shuffling is performed once the values are inserted into a column of the frame, shuffling and de-shuffling can be performed on a link-layer packet as well.

In embodiments implementing the above-described column sizing technique, deframer 510 inserts each received link-layer packet into frame 240, in the same manner that the link-layer packets were read at FIG. 4B. For example, deframer 510 writes each of the received link-layer packets into each of the frame's columns, which are slightly longer (e.g., by 1-byte as depicted in FIG. 4B) than the length of the received link-layer packets. Although FIG. 4B depicts an example of slightly longer being 1-byte, the column can be slightly longer by other values as well.

Figure 7:
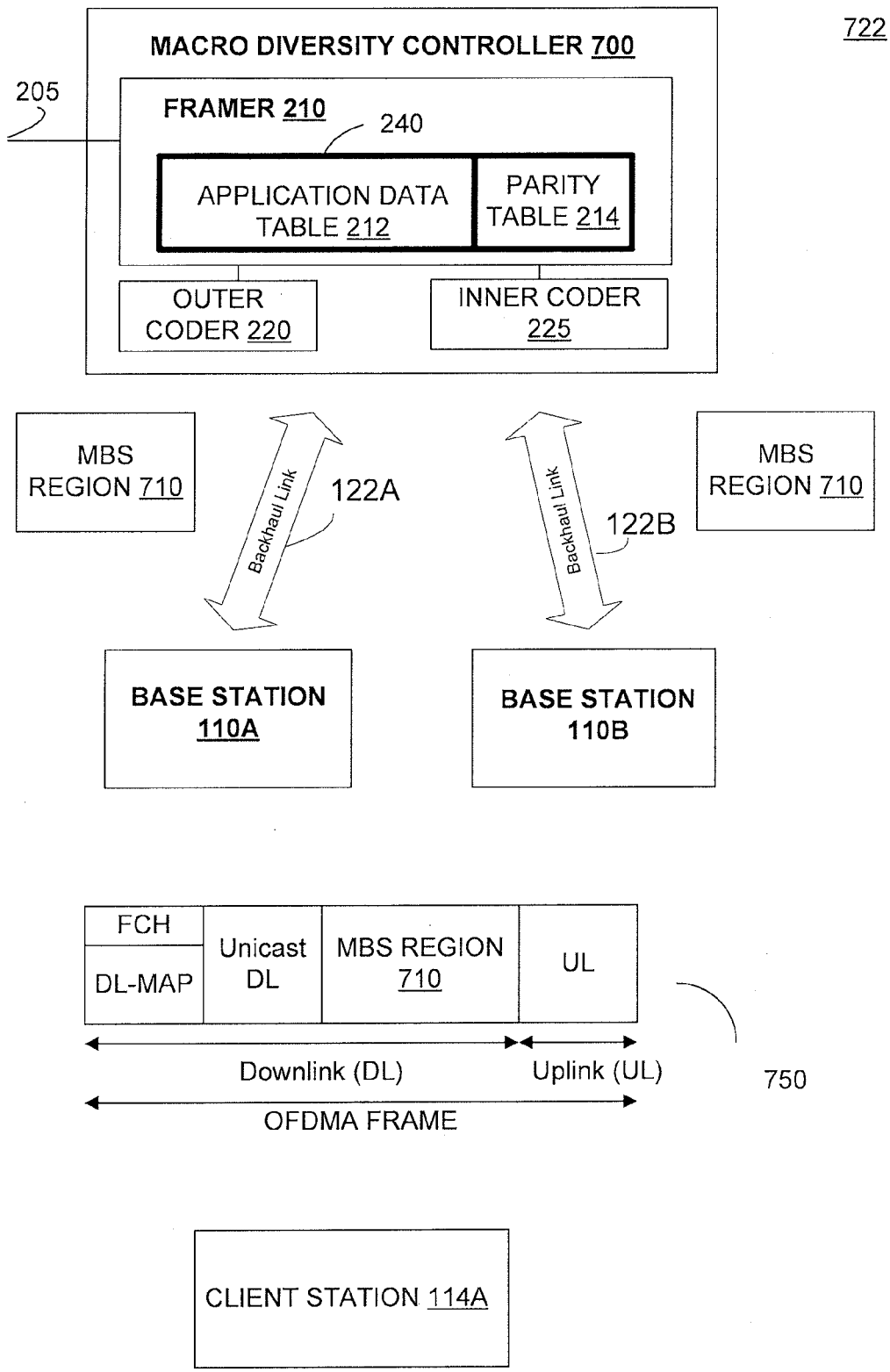
FIG. 7 depicts a block diagram of a controller implementing outer coding.

FIG. 7 depicts an implementation of framer 210, outer coder 220, and inner coder 225 in a macrodiversity controller 700. The output of the inner coder 225 may be link-layer packets that are used as protocol data units (PDUs), such as HARQ PDUs in conformance with IEEE 802.16. Moreover, the frame 240 of FIG. 7 may be column sized or column shuffled as described above. The PDUs are inserted into a macrodiversity region, such as a multicast and broadcast region (MBS) consistent with IEEE 802.16. As used herein, the phrase "macrodiversity region" refers to any type of data region of a data frame usable for broadcast data. The macrodiversity controller 700 distributes the MBS region 710 to zero or more base stations 110A-B. The macrodiversity controller 700 also schedules the transmissions of MBS regions 710 at base stations 110A and 110B, such that the base stations synchronously transmit the MBS regions over the same frequency using the same waveform (e.g., same modulation and coding scheme), and using the same framing parameters (e.g., number of symbols in the OFDMA frame, length of symbol, cyclic prefix, and the like). In the present embodiment, the base stations 110A and 110B each insert the MBS region 710 into an OFDMA frame 750. The base stations then transmit the OFDMA frame 750 to client stations, such as client station 114A. Moreover, the client station 114A may perform de-shuffling and/or configures a frame at the client station to have columns sized slightly larger than the size of the link-layer packets (as described above with respect to column sizing). The MBS region 710 is transmitted using macrodiversity, while other portions of the OFDMA frame 750 may not use macrodiversity.

At the client station, such as client station 114A, macrodiversity provides a so-called "macrodiversity gain" by combining the synchronous broadcast by base stations 110A and 110B. For example, base station 110A and base station 110B would each transmit frame 750 including the frame control header (FCH), downlink map (DL-MAP), and unicast downlink (DL) without using macrodiversity. Although the same MBS region is broadcast using macrodiversity from base stations 110A-B, the other data regions, such as the unicast downlink, may be unique to each base station. Base stations 110A and base station 110B each transmit MBS region 710, at the same frequency and at the same time using the same waveform, framing parameters, and a common waveform—providing at the client station 114A macrodiversity gain with respect to the transmitted MBS region 710.

Although the example of FIG. 7 refers to two base stations 110A and 110B, there may be additional base stations operating using macrodiversity to transmit MBS regions. Moreover, in the example of FIG. 7, the outer coder 220 would use the same RS code in a particular zone, such as a geographic area, to allow macrodiversity. However, in some implementations, the same system 722 includes another macrodiversity controller with a different outer code in its outer coder, in which case the system 722 may provide another zone of macrodiversity using the other outer code. In some implementations, the macrodiversity controller 700 may receive packets 205 corresponding to streams of multimedia content, such as digital broadcast television and the like, each stream associate with one or more zones. Moreover, although FIG. 7 depicts the macrodiversity controller 700 as separate from base stations 110A, 110B, and network controller 124, macrodiversity controller 700 may be incorporated into, or coupled to, at least one of a base station, a network controller, and the like.

Although the examples described herein are described in connection with, for example, a base station sending packets to a client station, the subject matter described herein may be used in other applications.

The subject matter described herein may be embodied in systems, apparatus, methods, and/or articles depending on the desired configuration. In particular, various implementations of the subject matter described, such as the components of the base stations, client stations as well as the macrodiversity controller, may be realized in digital electronic circuitry, integrated circuitry, specially designed ASICs (application specific integrated circuits), computer hardware, firmware, software, and/or combinations thereof. These various implementations may include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device. For example, the components of base station 110B, client station 114A, macrodiversity controller 700 and aspects of processes 300 and 600 may be realized in digital electronic circuitry, integrated circuitry, specially designed ASICs (application specific integrated circuits), computer hardware, firmware, software (including computer programs), and/or combinations thereof.

These computer programs (also known as programs, software, software applications, applications, components, or code) include machine instructions for a programmable processor, and may be implemented in a high-level procedural and/or object-oriented programming language, and/or in assembly/machine language. As used herein, the term "machine-readable medium" refers to any computer program product, computer-readable medium, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. Similarly, systems are also described herein that may include a processor and a memory coupled to the processor. The memory may include one or more programs that cause the processor to perform one or more of the operations described herein.

Although a few variations have been described in detail above, other modifications or additions are possible. In particular, further features and/or variations may be provided in addition to those set forth herein. For example, the implementations described above may be directed to various combinations and subcombinations of the disclosed features and/or combinations and subcombinations of several further features disclosed above. In addition, the logic flow depicted in the accompanying figures and/or described herein does not require the particular order shown, or sequential order, to achieve desirable results. Moreover, although the above describes various column and row operations (e.g., reading a column of a frame), a column of the frame can be swapped with a row (e.g., by rotating the frame by 90 degrees), in which case the above noted processes and systems continue to be operative. Other embodiments may be within the scope of the following claims.

What is claimed is:

1. A method comprising:
   inserting a received packet into a frame;
   encoding, using an outer code, the frame;
   inserting, into a link-layer packet, one or more values read from a column of the frame, the column shuffled by moving the values of the column based on an offset; and
   providing the link-layer packet to enable an inner code to encode the link-layer packet before transmission.

2. The method of claim 1 further comprising:
   implementing the outer code as a Reed-Solomon forward error-correction code and the frame as a Reed-Solomon table comprising a plurality of rows and a plurality of columns;
   encoding, using an inner code, the link-layer packet, the inner code implemented as a forward-error correction code; and
   sending the link-layer packet as a hybrid automatic retransmission request (HARQ) protocol data unit (PDU) including at least one of a cyclic redundancy check (CRC) and a header.

3. The method of claim 1, wherein inserting the received packet further comprises:
   receiving one or more application data packets, at least one of which is inserted into the frame.

4. The method of claim 1, wherein inserting the link-layer packet further comprises:
   determining the offset as a value representing a column number minus one.

5. The method of claim 1, wherein inserting into the link-layer packet further comprises:
   using zero as a first offset of a first column of the frame;
   using one as a second offset of a second column of the frame;
   shuffling, based on the first offset, the first column; and
   shuffling, based on the second offset, the second column.

6. The method of claim 1, further comprising:
   shuffling, based on the offset, the column before the link-layer packet is read from the column.

7. A method comprising:
   receiving a plurality of link-layer packets;
   inserting, into one of a plurality of columns of a frame, one of the received link-layer packets, the column de-shuffled by moving values of the column based on an offset,
   decoding, using an outer code, the frame; and
   inserting, into an application data packet, one or more values read from the decoded frame.

8. The method of claim 7, further comprising:
   implementing the outer code as a Reed-Solomon forward error-correction code and the frame as a Reed-Solomon table;
   decoding, using an inner code, received link-layer packets, the inner code implemented as a forward-error correction code; and
   removing at least one of a cyclic redundancy check and a header, when the received link-layer packets are implemented as a hybrid automatic retransmission request protocol data unit.

9. The method of claim 7, wherein inserting into one of the plurality of columns further comprises:
   determining the offset as a value representing a column number minus one.

10. The method of claim 7, wherein inserting into one of the plurality of columns further comprises:
    using zero as a first offset of a first column of the frame;
    using one as a second offset of a second column of the frame;
    de-shuffling, based on the first offset, the first column; and
    de-shuffling, based on the second offset, the second column.

11. The method of claim 7, further comprising:
    de-shuffling, based on the offset, the column after the decoded link-layer packet is inserted into the column.

12. A method comprising:
    inserting a received packet into a frame;
    encoding, using an outer code, the frame;
    inserting into a link-layer packet one or more values read from one of a plurality of columns of the frame, the columns configured to be longer than a length of the link-layer packet; and
    providing the link-layer packet to enable an inner code to encode the link-layer packet before transmission.

13. The method of claim 12 further comprising:
    implementing the outer code as a Reed-Solomon forward error-correction code and the frame as a Reed-Solomon table;
    encoding, using an inner code, the link-layer packet, the inner code implemented as a forward-error correction code; and
    sending the link-layer packet as a hybrid automatic retransmission request (HARQ) protocol data unit (PDU) including at least one of a cyclic redundancy check (CRC) and a header.

14. The method of claim 12 further comprising:
    receiving one or more application data packets, at least one of which is inserted into the frame.

15. The method of claim 12, wherein inserting into the link-layer packet further comprises:
    configuring the columns of the frame to be longer than a maximum length of a plurality of received packets.

* * * * *